(12) United States Patent
Mori

(10) Patent No.: US 6,407,416 B2
(45) Date of Patent: Jun. 18, 2002

(54) SEMICONDUCTOR DEVICE

(75) Inventor: Hirotaka Mori, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/778,889

(22) Filed: Feb. 8, 2001

(30) Foreign Application Priority Data

Jun. 15, 2000 (JP) ..................................... 2000-179252

(51) Int. Cl.$^7$ ........................ H01L 27/148; H01L 29/76
(52) U.S. Cl. ................................... 257/219; 257/288
(58) Field of Search ............................. 257/148, 219, 257/288, 377, 382, 383, 388, 413, 755

(56) References Cited

U.S. PATENT DOCUMENTS

| | | | |
|---|---|---|---|
| 4,404,578 A | * 9/1983 | Takafuji et al. | ............. 357/23 |
| 4,912,542 A | * 3/1990 | Suguro | ................. 357/67 |
| 5,063,424 A | * 11/1991 | Melanotte et al. | ......... 357/23.5 |
| 5,341,014 A | * 8/1994 | Fujii et al. | .................. 257/377 |
| 5,459,101 A | * 10/1995 | Fujii et al. | .................. 438/621 |
| 5,585,659 A | 12/1996 | Kobayashi et al. | |
| 5,652,183 A | 7/1997 | Fujii | |
| 5,874,353 A | 2/1999 | Lin et al. | |
| 5,940,725 A | 8/1999 | Hunter et al. | |
| 6,034,401 A | 3/2000 | Hsia et al. | |

* cited by examiner

Primary Examiner—Viet Q. Nguyen
Assistant Examiner—David Nhu
(74) Attorney, Agent, or Firm—Volentine Francos, PLLC

(57) ABSTRACT

A semiconductor device having a dual gate wherein impurities implanted into one gate region are prevented from reaching the other gate region and diffusing there. A wide gate separating region is secured between a p$^+$ gate region and an n$^+$ gate region. This gate separating region is a non-doped polysilicone region in which impurities such as B, P, and As are not implanted. Therefore, the probability that impurities existing in one gate region may reach the other gate through a gate electrode metal film is extremely low. Consequently, the characteristics of the semiconductor device are maintained in excellent condition.

15 Claims, 9 Drawing Sheets

SEMICONDUCTOR DEVICE

BACKGROUND OF THE INVENTION

The present invention relates to a semiconductor device. Prior Art

Generally, a gate portion of a semiconductor device having dual gate is formed as follows.

First, B ion or $BF_2$ ion is implanted into polysilicone film so as to form $p^+$ region and P or As ion is implanted so as to form $n^+$ region. At this time, a narrow linear region (hereinafter referred to as gate separating region) in which no ion is implanted is secured between the $p^+$ region and $n^+$ region to separate both the regions.

Next, for example, $WSi_2$ (tungsten silicide) is grown on the polysilicone film so as to form gate electrode metal film. The gate electrode metal film is formed across the $p^+$ region and the $n^+$ region.

Finally, the $p^+$ region and $n^+$ region function as $p^+$ gate and $n^+$ gate respectively.

FIG. 2 is a sectional view showing manufacturing process of a dual gate portion in a conventional semiconductor device. FIG. 3 is a perspective view of that dual gate portion.

As shown in FIG. 2(a), by implanting B or $BF_2$ ion into the polysilicone film 11 formed on the semiconductor substrate 10 such as silicone substrate, a $p^+$ region 12 is formed, and by implanting P or As ion, a $n^+$ region 13 is formed. Next, as shown in FIG. 2(b), a gate electrode metal film 14 is formed of, for example, $WSi_2$ over the $p^+$ gate 12 and $n^+$ gate 13.

As a result, as shown in FIG. 3, a semiconductor device having dual gate is obtained in which the $p^+$ region 12 and $n^+$ region 13 function as the $p^+$ gate 12 and $n^+$ gate 13.

However, the conventional semiconductor device has such a fear that the impurity (for example, B or $BF_2$) contained in the $p^+$ gate 12 diffuses into the $n^+$ gate 13 through the gate electrode metal film 14 or conversely the impurity (for example P or As) contained in the $n^+$ gate 13 diffuses into the $p^+$ gate 12 through the gate electrode metal film 14. If the diffusion of the impurity from one region to the other region is progressed, the characteristic of the semiconductor device is deteriorated considerably.

FIG. 4 shows a path for the impurity implanted into each gate region to pass through the gate electrode metal film 14 to reach the other gate region in the conventional semiconductor device.

Assuming that as shown in FIG. 4, the impurity moving from the $p^+$ gate 12 to the gate electrode metal film 14 reaches the $n^+$ gate 13 through the gate electrode metal film 14, the moving distance of the impurity increases or decreases depending on the width of the gate separating region. Likewise, assuming that the impurity moving from the $n^+$ gate 13 to the gate electrode metal film 14 reaches the $p^+$ gate 12 through the gate electrode metal film 14, the moving distance of the impurity also increases or decreases depending on the width of the gate separating region.

The probability that the impurity moving from a gate to the gate electrode metal film 14 may reach the other region increases as the moving distance of the impurity in the gate electrode metal film 14 decreases.

In this point, because the width of the gate separating region in the conventional semiconductor device is small, necessarily, the moving distance of the impurity in the gate electrode metal film 14 is short. Therefore, in the conventional semiconductor device, there is a fear that most of the impurity such as B, $BF_2$, P, As implanted into the $p^+$ gate 12 and $n^+$ gate 13 may reach the other gate through the gate electrode metal film 14 and diffuse there.

If each impurity implanted into the $p^+$ gate 12 or $n^+$ gate 13 moves to the other region and diffuse there, the physical property of the semiconductor composing the $p^+$ gate 12 and $n^+$ gate 13 changes, so that the electrical characteristics of the semiconductor device deteriorate remarkably.

SUMMARY OF THE INVENTION

The present invention has been achieved in views of the above described problems and therefore, an object of the invention is to provide a semiconductor device having dual gate wherein the impurity implanted into a gate is prevented from reaching the other gate and diffusing there.

To achieve the above object, according to a first aspect of the invention, there is provided a semiconductor device comprising: a first gate region composed of semiconductor containing a first impurity; a second gate region composed of semiconductor containing a second impurity; and a gate electrode film adjoining the first gate region and the second gate region. In this semiconductor device, a length of the shortest path of plural paths connecting the first gate region to the second gate region, selected in the gate electrode film, is longer than a diffusion distance of the first impurity and a diffusion distance of the second impurity in the gate electrode film.

With such a structure, the first impurity never reaches the second gate region through the gate electrode metal film or the second impurity never reaches the first gate region through the gate electrode metal film.

According to a second aspect of the invention, there is provided a semiconductor device comprising: a first gate region composed of semiconductor containing a first impurity; a second gate region composed of semiconductor containing a second impurity; and a gate electrode film adjoining the first gate region and the second gate region. In this semiconductor device, the gate electrode film has a sectional area smaller than a diameter of crystal grain of material composing the gate electrode film locally in a region not adjoining the first gate region and the second gate region.

With such a structure, the diffusion of the first impurity and second impurity in the gate electrode film is limited remarkably. In other words, the gate electrode film increases so-called diffused resistance in the diffusion of the first impurity and second impurity.

According to a third aspect of the invention, there is provided a semiconductor device comprising: a first gate region composed of semiconductor containing a first impurity; a second gate region composed of semiconductor containing a second impurity; and a gate electrode film adjoining the first gate region and the second gate region. In this semiconductor device, the gate electrode film has plural pits in a region not adjoining the first gate region and the second gate region. Preferably, a gap between a pit and the other pit nearest the pit is smaller than a diameter of crystal grain of material composing the gate electrode film.

With such a structure, the diffusion of the first impurity and second impurity in the gate electrode film is limited remarkably between the respective pits.

According to a fourth aspect of the invention, there is provided a semiconductor device comprising: a first gate region composed of semiconductor containing a first impurity; a second gate region composed of semiconductor containing a second impurity; and a gate electrode film adjoining the first gate region and the second gate region. In this semiconductor device, the gate electrode film has a labyrinth portion for bending plural paths connecting the first gate region to the second gate region, selected in the gate electrode film.

With such a structure, even if the first impurity and second impurity try to move to the second gate region and first gate region respectively through the gate electrode film, they must move at a long distance to pass through the labyrinth portion. Therefore, the first impurity and second impurity move at a diffusion distance possessed thereby before they reach the second gate region and first gate region. Consequently, they cannot reach the second gate region and first gate region.

According to a fifth aspect of the invention, there is provided a semiconductor device comprising: a first gate region composed of semiconductor containing a first impurity; a second gate region composed of semiconductor containing a second impurity; and a gate electrode film adjoining the first gate region and the second gate region. This semiconductor device further comprises an impurity trap region for trapping the first impurity invading into the gate electrode film from the first gate region and the second impurity invading into the gate electrode film from the second gate region.

With such a structure, the first impurity and second impurity diffusing in the gate electrode film are trapped by the impurity trap region, so that they never reach the second gate region or first gate region.

According to a sixth aspect of the invention, there is provided a semiconductor device comprising: a first gate region composed of semiconductor containing a first impurity; a second gate region composed of semiconductor containing a second impurity; and a gate electrode film adjoining the first gate region and the second gate region. In this semiconductor device, the gate electrode film has an impurity diffusion preventing region for preventing diffusion of the first impurity and the second impurity.

With such a structure, the first impurity and second impurity diffusing in the gate electrode film is prevented from diffusing further by the impurity diffusion preventing region. Therefore, if the impurity diffusion preventing region is disposed at an appropriate position in the gate electrode film, the first impurity is prevented from reaching the second gate region and the second impurity is prevented from reaching the first gate region.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

Figure 1:
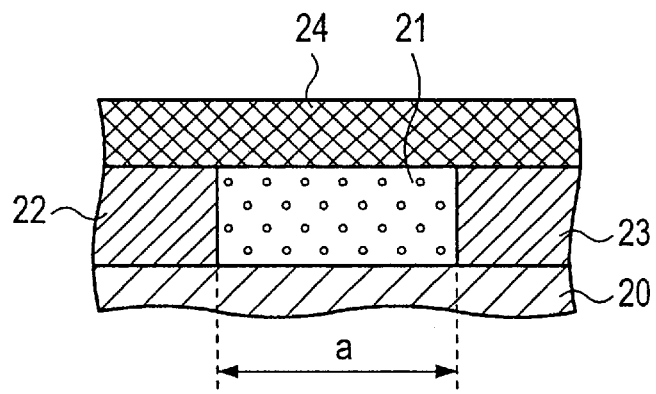
FIG. 1 is a sectional view of a dual gate in a semiconductor device according to a first embodiment of the present invention.
Figure 2A:
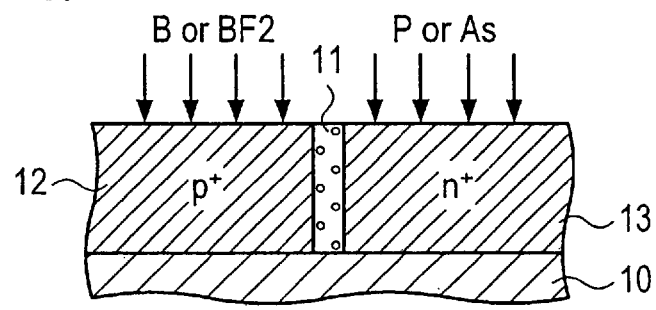
FIG. 2 is a sectional view showing manufacturing process of the dual gate of a conventional semiconductor device.
Figure 2B:
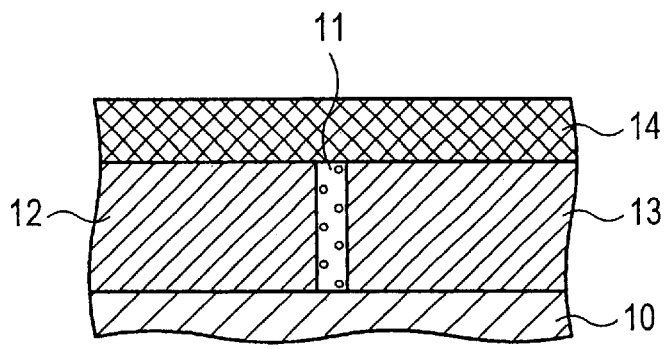
Figure 3:
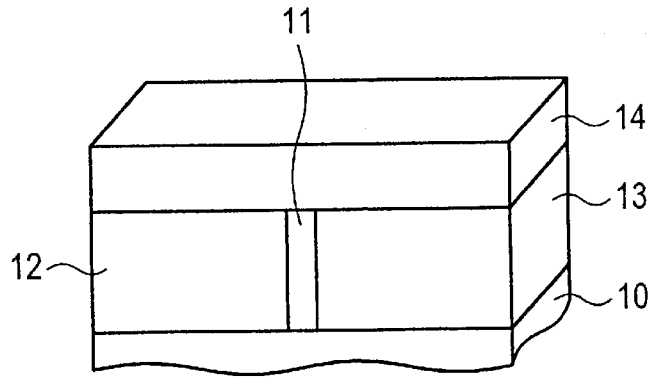
FIG. 3 is a perspective view of the dual gate of the conventional semiconductor device.
Figure 4:
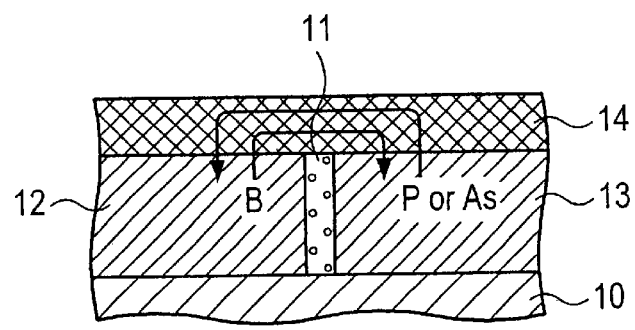
FIG. 4 is a sectional view showing a path for impurity implanted into each gate region to reach the other gate region through gate electrode metal film in the conventional semiconductor device.

Hereinafter, the preferred embodiments of the semiconductor device of the present invention will be described in detail with reference to the accompanying drawings. In a following description and accompanying drawings, like reference numerals are attached to components having substantially the same function and structure and a description thereof is omitted.

First Embodiment

Figure 5:
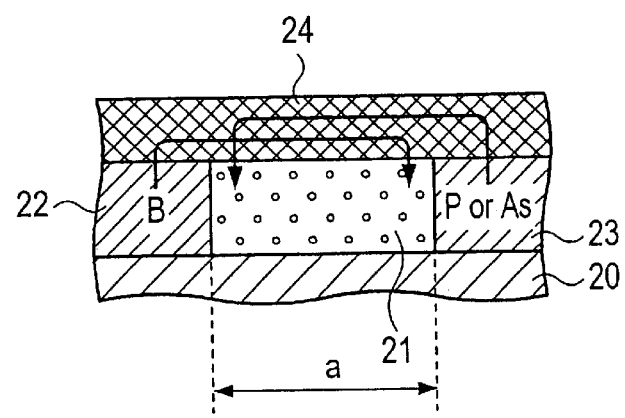
FIG. 5 is a sectional view showing passage of impurity implanted in each gate region in the gate electrode metal film in the semiconductor device according to the first embodiment of the present invention.

FIG. 1 indicates a sectional view of a dual gate in a semiconductor device according to a first embodiment of the present invention. FIG. 5 indicates a sectional view showing passage of impurity implanted in each gate region in the gate electrode metal film in the semiconductor device according to the first embodiment of the present invention.

As shown in FIG. 1, the semiconductor device of this embodiment of the present invention includes dual gate comprising $p^+$ gate 22 acting as a p type polysilicone gate, $n^+$ gate 23 acting as a n type polysilicone gate and gate electrode metal film 24.

The $p^+$ region formed by implanting B or $BF_2$ ion in polysilicone film 21 formed on a semiconductor substrate 20 such as silicone substrate functions as $p^+$ gate 22. The $n^+$ region formed by implanting P or As ion into the polysilicone film 21 functions as $n^+$ gate 23.

The gate electrode metal film 24 is formed by growing, for example, $WSi_2$ on the $p^+$ region, $n^+$ region and a gate separating region 21 to be mentioned later. That is, the gate electrode metal film 24 is formed over the $p^+$ region and $n^+$ region across the gate separating region 21.

A wide gate separating region 21 is secured between the $p^+$ gate 22 and $n^+$ gate 23. This gate separating region 21 is a non-doped polysilicone region in which such impurity as B, P, As is not implanted. Because the wide gate separating region 21 is provided, a gap between the $p^+$ gate 22 and $n^+$ gate 23 is large. This gap, namely the width a of the gate separating region 21 is preferred to be more than 50 μm.

If as shown in FIG. 5, such impurities as B, $BF_2$, P and As implanted in the $p^+$ gate 22 and $n^+$ gate 23 move to the other gate, the impurities pass an assumed path in the gate electrode metal film 24. However, because the gate separating region 21 having the width a is formed between the $p^+$ gate 22 and $n^+$ gate 23, a distance necessary for the impurities to move to the other gate in the gate electrode metal film 24 is prolonged. Therefore, a probability that the impurities existing in one gate reaches the other gate becomes very low. Particularly if the shortest path for each impurity to pass to move from one gate to the other gate in the gate electrode metal film 24 is longer than a diffusion distance of each impurity in the gate electrode metal film 24, the impurity existing in one gate never reaches the other gate.

Further, the gate electrode metal film 24 is composed of $WSi_2$. The diffusion speed of the impurity in the $WSi_2$ film is slow. Therefore, in the manufacturing process of the semiconductor device, even if each impurity implanted in the $p^+$gate 22 and $n^+$gate 23 is activated when the semiconductor device is heated up to generally the highest heat treatment temperature (about 1000° C.), the quantity of the impurity which reaches the other gate is very small.

Because according to the semiconductor device of this embodiment, as described above, the width a of the gate separating region 21 is large, the length of the gate electrode metal film 24 between the $p^+$ gate 22 and $n^+$ gate 23, which can be a path for the impurity to pass, is increased. Thus, this prevents the impurity implanted in one gate from reaching the other gate and diffusing therein. Consequently, the characteristic of the semiconductor device is maintained in an excellent condition.

Second Embodiment

The second embodiment of the present invention will be described.

Meanwhile, a description of substantially the same structure and manufacturing method as the first embodiment is omitted.

Figure 6:
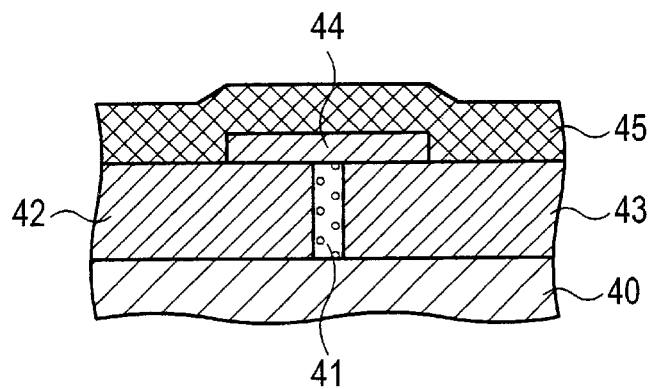
FIG. 6 is a sectional view of the dual gate in the semiconductor device according to a second embodiment of the present invention.
Figure 7:
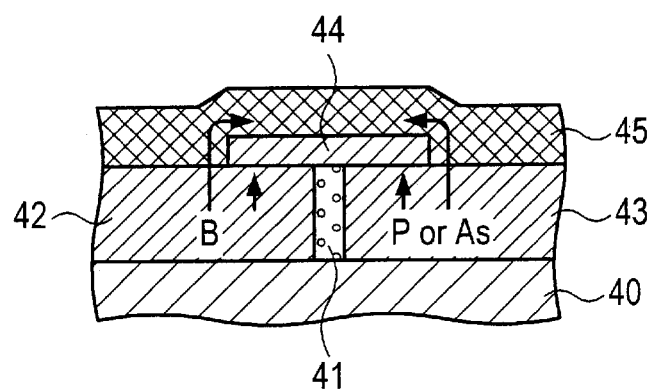
FIG. 7 is a sectional view showing passage of impurity implanted in each gate in the gate electrode metal film in the semiconductor device according to the second embodiment of the present invention.

FIG. 6 shows a section of dual gate possessed by the semiconductor device according to the second embodiment of the present invention. FIG. 7 shows passage of the impurity implanted in each gate region in the gate electrode metal film of the semiconductor device according to the second embodiment of the present invention.

The dual gate possessed by the semiconductor device of this embodiment is formed as follows.

First, B or $BF_2$ ion is implanted into polysilicone film formed on a semiconductor substrate 40 such as silicone substrate so as to form $p^+$ region and then, P or As ion is implanted so as to form $n^+$ region. The $p^+$ region formed here functions as $p^+$ date 42 and the $n^+$ region functions as $n^+$ gate 43.

A gate separating region 41 is secured between the $p^+$gate 42 and $n^+$gate 43. This gate separating region 41 is a non-doped polysilicone region in which the impurity such as B, P, As is not implanted.

Next, SiN film, which is an insulating film, is formed on an entire surface of the polysilicone film by, for example, plasma CVD method. The thickness of this SiN film is about 100 Å.

After that, the SiN film is patterned by photo etching. As shown in FIG. 6, the patterned SiN film 44 covers a top of the gate separating region 41, top of a region of the $p^+$ gate 42 adjoining the gate separating region 41 and top of a region of the $n^+$ gate 43 adjoining the gate separating region 41.

Further, gate electrode metal film 45 is formed of, for example, $WSi_2$ on the top face of the $p^+$ gate 42, $n^+$ gate 43 and SiN film 44.

The SiN film 44 functions as a barrier for preventing the impurity contained in each gate region from invading into the gate electrode metal film 45.

When as shown in FIG. 7, the impurity such as B, P, As implanted into the $p^+$ gate 42 and $n^+$ gate 43 moves to the other gate, the impurity passes an assumed path in the gate electrode metal film 45. At this time, an invasion position of the impurity contained in each gate region into the gate electrode metal film 45 is limited to a place far from the gate separating region 41 by the barrier function of the SiN film 44. Thus, the path for the impurity contained in the gate electrode metal film 45 to pass to move to the other gate is prolonged. Therefore, the probability that the impurity existing in one gate reaches the other gate is extremely low.

Because as described above, the semiconductor device of this embodiment includes the SiN film 44, the impurity implanted into one gate is prevented from reaching the other gate and from diffusing there. Consequently, the characteristic of the semiconductor device is maintained in an excellent condition.

Third Embodiment

The third embodiment of the present invention will be described.

A description of substantially the same structure and manufacturing method of the semiconductor device according to the first and second embodiments is omitted.

Figure 8:
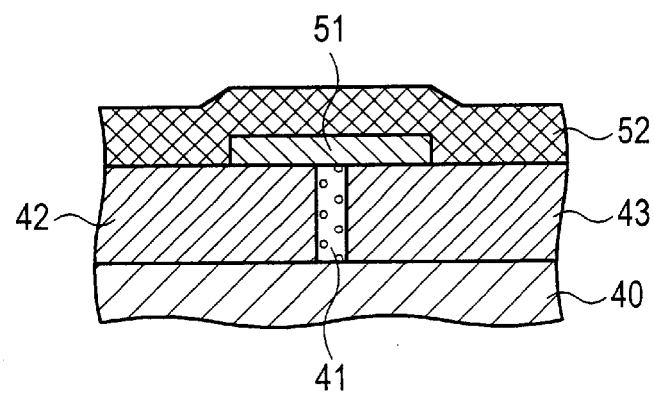
FIG. 8 is a sectional view of the dual gate in the semiconductor device according to a third embodiment of the present invention.
Figure 9:
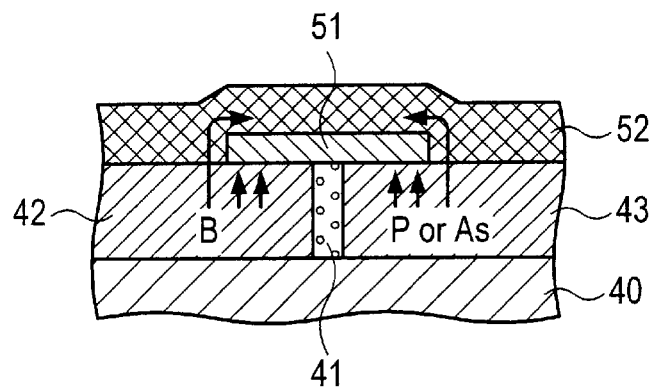
FIG. 9 is a sectional view showing passage of impurity implanted in each gate in the gate electrode metal film in the semiconductor device according to the third embodiment of the present invention.

FIG. 8 shows a section of dual gate possessed by the semiconductor device according to the third embodiment of the present invention. FIG. 9 shows passage of the impurity implanted into each gate region in the gate electrode metal film of the semiconductor device according to the third embodiment of the present invention.

In the semiconductor device of this embodiment, the SiN film 44 of the semiconductor device of the second embodiment is replaced with WN film 51.

As shown in FIG. 8, this WN film 51 covers top of the gate separating region 41, top of a region of the $p^+$ gate 42 adjoining the gate separating region 41 and top of a region of the $n^+$ gate 43 adjoining the gate separating region 41. The thickness of the WN film 51 is about 100 Å.

Further, gate electrode metal film 52 is formed of, for example, $WSi_2$ on top face of the $p^+$ gate 42, $n^+$ gate 43 and WN film 51.

The WN film 51 functions as a barrier for preventing the impurity contained in each gate from invading into the gate electrode metal film 52.

When as shown in FIG. 9, the impurity such as B, P, As implanted into the $p^+$ gate 42 and $n^+$ gate 43 moves to the other gate, the impurity passes an assumed path in the gate electrode metal film 52.

At this time, an invasion position of the impurity contained in each gate region into the gate electrode metal film 52 is limited to a place far from the gate separating region 41 by the barrier function of the WN film 51. Thus, the path for the impurity contained in the gate electrode metal film 52 to pass to move to the other gate is prolonged. Therefore, the probability that the impurity existing in one gate reaches the other gate is extremely low.

Because as described above, the semiconductor device of this embodiment includes the WN film 51, the impurity implanted into one gate is prevented from reaching the other gate and diffusing there. Consequently, the characteristic of the semiconductor device is maintained in an excellent condition.

Further, the WN film 51 has conductivity. Therefore, according to the semiconductor device of this embodiment, a gate electrode having a lower electric resistance than the semiconductor device of the second embodiment is obtained.

Fourth Embodiment

The fourth embodiment of the present invention will be described.

A description of substantially the same structure and manufacturing method of the semiconductor device according to the first to third embodiments is omitted.

Figure 10:
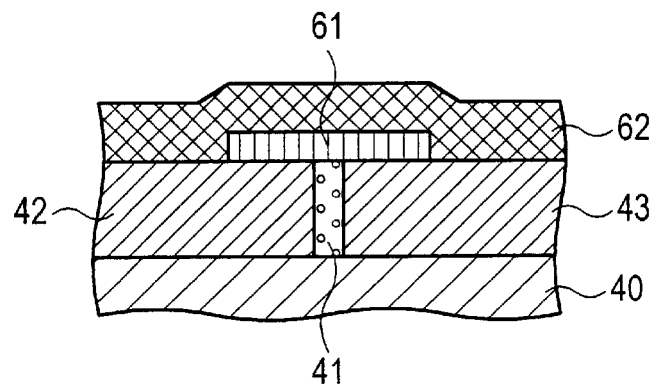
FIG. 10 is a sectional view of the dual gate in the semiconductor device according to a fourth embodiment of the present invention.
Figure 11:
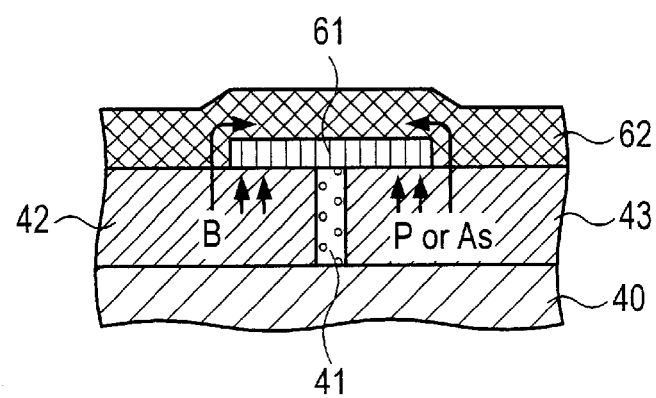
FIG. 11 is a sectional view showing passage of impurity implanted in each gate in the gate electrode metal film in the semiconductor device according to the fourth embodiment of the present invention.

FIG. 10 shows a section of dual gate possessed by the semiconductor device according to the fourth embodiment of the present invention. FIG. 11 shows passage of the impurity implanted into each gate region in the gate electrode metal film of the semiconductor device according to the fourth embodiment of the present invention.

In the semiconductor device of this embodiment, the SiN film 44 and WN film 51 of the semiconductor device of the second and third embodiments are replaced with TiN film 61.

As shown in FIG. 10, this TiN film 61 covers top of the gate separating region 41, top of a region of the $p^+$ gate 42 adjoining the gate separating region 41 and top of a portion of the $n^+$ gate 43 adjoining the gate separating region 41. The thickness of the TiN film 61 is about 100 Å.

Further, gate electrode metal film 62 is formed of, for example, $WSi_2$ on top face of the $p^+$ gate 42, $n^+$ gate 43 and TiN film 61.

The TiN film 61 functions as a barrier for preventing the impurity contained in each gate region from invading into the gate electrode metal film 62.

When as shown in FIG. 11, the impurity such as B, P, As implanted into the $p^+$ gate 42 and $n^+$ gate 43 moves to the other gate, the impurity passes an assumed path in the gate electrode metal film 62.

At this time, an invasion position of the impurity contained in each gate region into the gate electrode metal film 62 is limited to a place far from the gate separating region 41 by the barrier function of the TiN film 61. Thus, the path for the impurity contained in the gate electrode metal film 62 to pass to move to the other gate is prolonged. Therefore, the probability that the impurity existing in one gate reaches the other gate is extremely low.

Because as described above, the semiconductor device of this embodiment includes the TiN film 61, the impurity implanted into one gate is prevented from reaching the other gate and diffusing there. Consequently, the characteristic of the semiconductor device is maintained in an excellent condition.

Further, the TiN film 61 has conductivity. Therefore, according to the semiconductor device of this embodiment, a gate electrode having a lower electric resistance than the semiconductor device of the second embodiment is obtained.

Further, because Ti has a high reactivity to Si, assuming that composition of the TiN film 61 is Ti-rich, the TiN film 61 indicates a slight reaction to the polysilicone film in contact with a bottom face of the TiN film 61 and gate electrode metal film 62 composed of $WSi_2$ in contact with a top face thereof. Therefore, adhesion between the polysilicone film, TiN film 61 and gate electrode metal film 62 is intensified.

According to the semiconductor device of the third embodiment, a supply of Si from the polysilicone film to the gate electrode metal film 52 is prevented by the WN film 51. The gate electrode metal film 62 in the semiconductor device of this embodiment has a high adhesion to the polysilicone film and TiN film 61 so that it is unlikely to peel off.

Fifth Embodiment

The fifth embodiment of the present invention will be described.

A description of substantially the same structure and manufacturing method of the semiconductor device according to the first to fourth embodiment is omitted.

Figure 12:
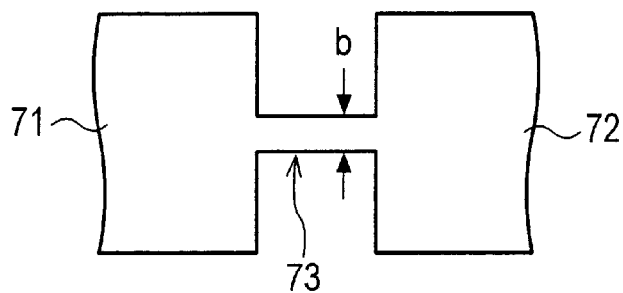
FIG. 12 is a plan view of a gate electrode metal film of the dual gate in the semiconductor device according to a fifth embodiment of the present invention.
Figure 13:
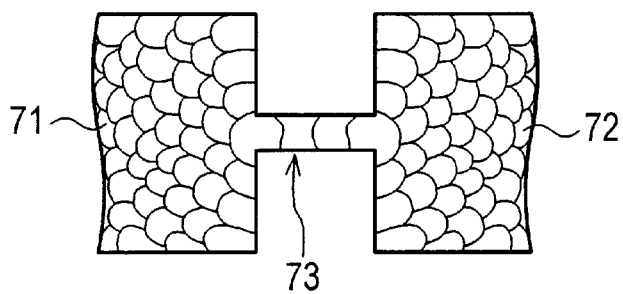
FIG. 13 is a plan view showing a grain boundary of the gate electrode metal film in the semiconductor device according to a fifth embodiment of the present invention.

FIG. 12 is a plan view of the gate electrode metal film of dual gate possessed by the semiconductor device according to the fifth embodiment of the present invention. FIG. 13 shows grain boundary of the gate electrode metal film in the semiconductor device according to the fifth embodiment of the present invention.

The gate electrode metal film is formed by growing, for example, $WSi_2$ over the $p^+$ region, $n^+$ region and gate separating region between the $p^+$ region and $n^+$ region. That is, the gate electrode metal film is formed over the $p^+$ region and $n^+$ region across the gate separating region.

As shown in FIG. 12, the gate electrode metal film is patterned to a shape comprising three regions, namely, first gate electrode metal region 71, second gate electrode metal region 72 and third gate electrode metal region 73 by photo etching.

The first gate electrode metal region 71 is located over the p+ region, the second gate electrode metal region 72 is located over the n+ region and the third gate electrode metal region 73 is located on the gate separating region.

The width b of the third gate electrode metal region 73 is smaller than the width of the first gate electrode metal region 71 and the width of the second gate electrode metal region 72. The width of the third gate electrode metal region 73 is adjusted locally to less than 0.05 μm.

In the gate electrode metal film having such a structure, the gain boundary of the WSi$_2$ composing the first gate electrode metal region 71, second gate electrode metal region 72 and third gate electrode metal region 73 is as shown in FIG. 13.

Usually, an average diameter (grain size) of crystal grain of the WSi$_2$ becomes 0.02 to 0.05 μm by heat treatment in the manufacturing process for the semiconductor device. For the reason, in the third gate electrode metal region 73 in which the width b is adjusted to less than 0.05 μm, the grain boundary line appears predominantly in the width direction. That is, the WSi$_2$ in the third gate electrode metal region 73 becomes crystal structure in which the boundary line crosses the length direction of the third gate electrode metal region 73 like bamboo joint (hereinafter called bamboo structure).

When the impurity such as B, P, As implanted in the p+ gate and n+ gate moves in the gate electrode metal film, each impurity moves along mainly the grain boundary of the WSi$_2$.

Consequently, the impurity invading from the p+ gate into the first gate electrode metal film 71 cannot pass the third gate electrode metal region 73 having the bamboo structure and it does not reach the second gate electrode metal region 72 so that it does not diffuse within the n+ gate.

The impurity invading into the second gate electrode metal film 72 from the n+ gate cannot pass the third gate electrode metal film 73 having the bamboo structure and it does not reach the first gate electrode metal film 71 so that it does not diffuse within the p+ gate.

According to the semiconductor device of this embodiment, as described above, because the gate electrode metal film is provided with the third gate electrode metal region 73 having such a small width, the impurity implanted into one gate is prevented from reaching the other gate and diffusing there. As a result, the characteristic of the semi-conductor device is maintained in an excellent condition.

Sixth Embodiment

The sixth embodiment of the present invention will be described.

A description of substantially the same structure and manufacturing method of the semiconductor device according to the first to fifth embodiment is omitted.

Figure 14:
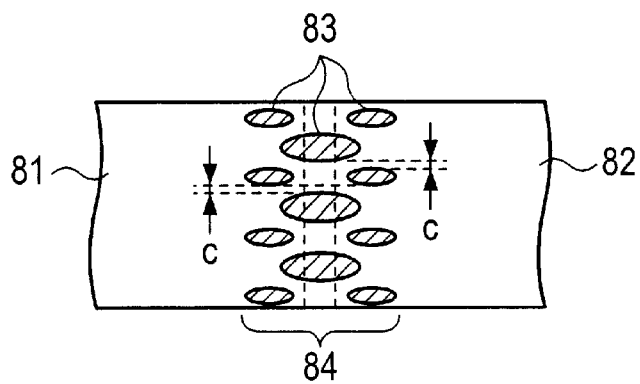
FIG. 14 is a plan view of the gate electrode metal film of the dual gate in the semiconductor device according to a sixth embodiment of the present invention.
Figure 15:
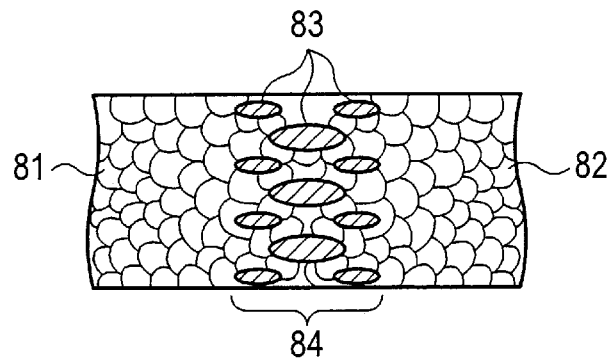
FIG. 15 is a plan view showing a grain boundary of the gate electrode metal film in the semiconductor device according to the sixth embodiment of the present invention.

FIG. 14 is a plan view of the gate electrode metal film of dual gate possessed by the semiconductor device according to the sixth embodiment of the present invention. FIG. 15 shows grain boundary of the gate electrode metal film in the semiconductor device according to the sixth embodiment of the present invention.

The gate electrode metal film is formed by growing, for example, WSi$_2$ over the p+ region, n+ region and gate separating region between the p+ region and n+ region. That is, the gate electrode metal film is formed over the p+ region and n+ region across the gate separating region.

As shown in FIG. 14, the gate electrode metal film is comprised of three regions including the first gate electrode metal film 81, the second gate electrode metal film 82 and the third gate electrode metal film 84.

The first gate electrode metal region 81 is located over the p+ region, the second gate electrode metal region 82 is located over the n+ region and the third gate electrode metal region 84 is located on the gate separating region.

The third gate electrode metal film 84 includes a plurality of pits 83 formed by removing metal by photo etching.

A distance c between respective pits 84 is adjusted locally to less than 0.05 μ.

In the gate electrode metal film having such a structure, the gain boundary of the WSi$_2$ composing the first gate electrode metal region 81, second gate electrode metal region 82 and third gate electrode metal region 84 is as shown in FIG. 15.

Usually, the average diameter of the crystal grain of the WSi$_2$ becomes about 0.02 to 0.05 μm by heat treatment in the manufacturing process for the semiconductor device. Thus, in the third gate metal region 84 having a plurality of the pits 83 in which the distance c is adjusted to less than 0.05 μm, the WSi$_2$ is formed in the bamboo structure.

Consequently, the impurity invading from the p+ gate into the first gate electrode metal film 81 cannot pass the third gate electrode metal region 84 having the bamboo structure and it does not reach the second gate electrode metal region 82 so that it does not diffuse within the n+ gate.

The impurity invading into the second gate electrode metal film 82 from the n+ gate cannot pass the third gate electrode metal film 84 having the bamboo structure and it does not reach the first gate electrode metal film 81 so that it does not diffuse within the p+ gate.

According to the semiconductor device of this embodiment, the third gate electrode metal region 84 having a plurality of the pits 83 is provided on the gate electrode metal film. Therefore, the impurity implanted into one gate is prevented from reaching the other gate and diffusing there. Consequently, the characteristic of the semiconductor device is maintained in an excellent condition.

According to the semiconductor device of this embodiment, the third gate electrode metal region 84 is capable of securing a larger sectional area than the third gate electrode metal region 73 provided on the semiconductor device of the fifth embodiment.

Therefore, a rise of electric resistance between the first gate electrode metal film 81 and the second gate electrode metal film 82 is prevented thereby securing a gate electrode having a smaller electric resistance.

Seventh Embodiment

The seventh embodiment of the present invention will be described below.

Meanwhile, a description of substantially the same structure and manufacturing method as the semiconductor device according to the first to sixth embodiments is omitted.

Figure 16:
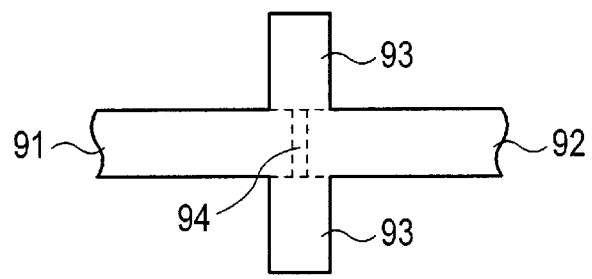
FIG. 16 is a plan view of the gate electrode metal film of the dual gate in the semiconductor device according to a seventh embodiment of the present invention.
Figure 17:
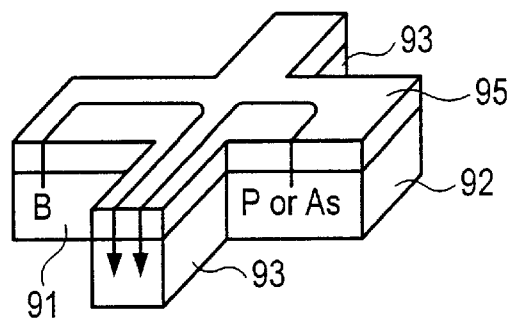
FIG. 17 is a perspective view of a dual gate portion in the semiconductor device according to the seventh embodiment of the present invention.

FIG. 16 is a plan view of the gate electrode metal film of dual gate possessed by the semiconductor device according to the seventh embodiment of the present invention. FIG. 17 is a perspective view of a dual gate portion in the semiconductor device according to the seventh embodiment of the present invention.

The dual gate in the semiconductor device of this embodiment is formed as follows.

First, the impurity is implanted into the polysilicone film formed on the semiconductor substrate so as to form p+ gate 91 and n+ gate 92. A gate separating region 94 is secured between p+ gate 91 and n+ gate 92. This gate separating region 94 is a non-doped polysilicone region in which no impurity is implanted.

A gate electrode metal film 95 is formed over the p+ gate 91, n+ gate 92 and the gate separating region 94.

Next, the gate electrode metal film 95 and the polysilicone film below it are patterned by photo etching. By this patterning, as shown in FIGS. 16, 17, dual gate comprised of the gate electrode metal film 95, p$^+$ gate 91, n$^+$ gate 92, gate separating region 94 and two extended regions 93 integrated with the gate separating region 94 is formed.

Each extended region 93 is a non-doped polysilicone region in which no impurity is implanted like the gate separating region 94. Each extended region 93 is formed so as to be extended from the gate separating region 94 in a direction perpendicular to a direction in which the p$^+$ gate 91, gate separating region 94 and n$^+$ gate 92 are arranged continuously.

As described above, the semiconductor device according to this embodiment has a substantially cross-like dual gate.

When the impurity contained in the p$^+$ gate 91 and n$^+$ gate 92 moves to the other gate region through the gate electrode metal film 95, most of the moving impurity is absorbed in each extended region 93 as shown in FIG. 17. Therefore, the probability that the impurity contained in one gate region may reach the other gate region located at an opposite position is extremely low.

As described above, because according to the semiconductor device of this embodiment, the two extended regions 93 for absorbing the impurity are provided between the p$^+$ gate 91 and n$^+$ gate 92, the impurity implanted into one gate is prevented from reaching the other gate and diffusing there. Consequently, the characteristic of the semiconductor device is maintained in an excellent condition.

Eighth Embodiment

The eighth embodiment of the present invention will be described below.

Meanwhile, a description of substantially the same structure and manufacturing method as the semiconductor device according to the first to seventh embodiments is omitted.

Figure 18:
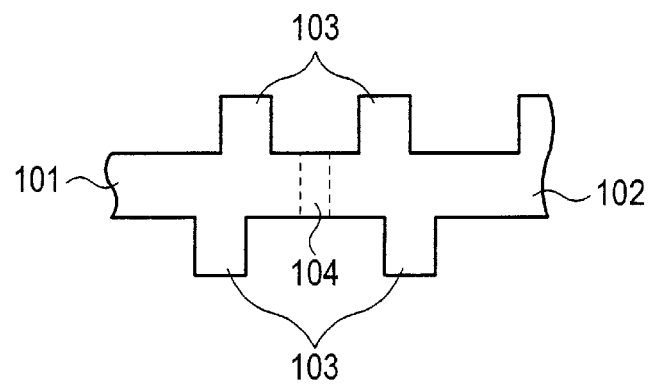
FIG. 18 is a plan view of the gate electrode metal film of the dual gate in the semiconductor device according to en eighth embodiment of the present invention.
Figure 19:
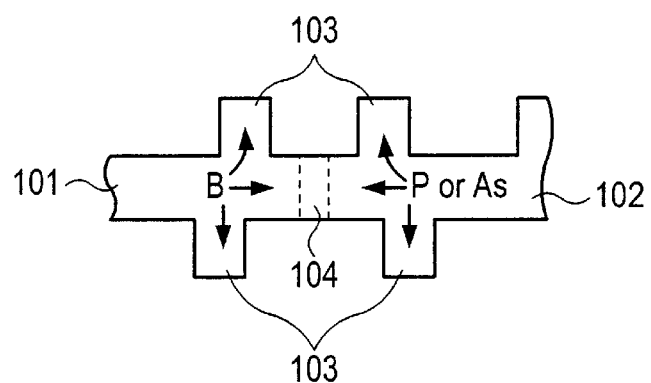
FIG. 19 is a plan view showing passage of impurity implanted in each gate in the gate electrode metal film in the semiconductor device according to the eighth embodiment of the present invention.

FIG. 18 is a plan view of the gate electrode metal film of dual gate possessed by the semiconductor device according to the eighth embodiment of the present invention. FIG. 19 indicates passage of the impurity implanted into each gate region in the gate electrode metal film.

The dual gate in the semiconductor device of this embodiment is formed as follows.

First, the impurity is implanted into the polysilicone film formed on the semiconductor substrate so as to form a p$^+$ gate 101 and a n$^+$ gate 102. The p$^+$ gate 101 and a n$^+$ gate 102 are surrounded by the non-doped polysilicone region in which no impurity is implanted. A gate separating region 104 is secured between the p$^+$ gate 101 and n$^+$ gate 102. This gate separating region 104 is also a non-doped polysilicone region in which no impurity is implanted.

A gate electrode metal film is formed over the p$^+$ gate 101, n$^+$ gate 102 and the gate separating region 104.

Next, the gate electrode metal film and the polysilicone film below it are patterned by photo etching. By this patterning, as shown in FIG. 18, dual gate comprised of the gate electrode metal film, p$^+$ gate 101, n$^+$ gate 102, gate separating region 104 and plural extended regions 103 integrated is formed.

Each extended region 103 is a non-doped polysilicone region in which no impurity is implanted like the gate separating region 104. Each extended region 103 is formed so as to be extended from the sides of the p$^+$ gate 101 and n$^+$ gate 102 in a direction perpendicular to a direction in which the p$^+$ gate 101, gate separating region 104 and n$^+$ gate 102 are arranged continuously.

The semiconductor device of this embodiment has a dual gate shaped substantially in a centipede (or comb).

When the impurity contained in the p$^+$ gate 101 and n$^+$ gate 102 moves to the other gate region through the gate electrode metal film, most of the moving impurity is absorbed in the plural extended region 103 as shown in FIG. 19. Therefore, the probability that the impurity contained in one gate region may reach the other gate region located at an opposite position is extremely low.

As described above, because according to the semiconductor device of this embodiment, the plural extended regions 103 for absorbing the impurity are provided on the sides of the p$^+$ gate 101 and n$^+$ gate 102, the impurity implanted into one gate is prevented from reaching the other gate and diffusing there. Consequently, the characteristic of the semiconductor device is maintained in an excellent condition.

Further, according to the semiconductor device of this embodiment, a layout for each extended region 103 can be selected arbitrarily thereby improving freedom of designing the gate portion.

Ninth Embodiment

The ninth embodiment of the present invention will be described below.

Meanwhile, a description of substantially the same structure and manufacturing method as the semiconductor device according to the first to eighth embodiments is omitted.

Figure 20:
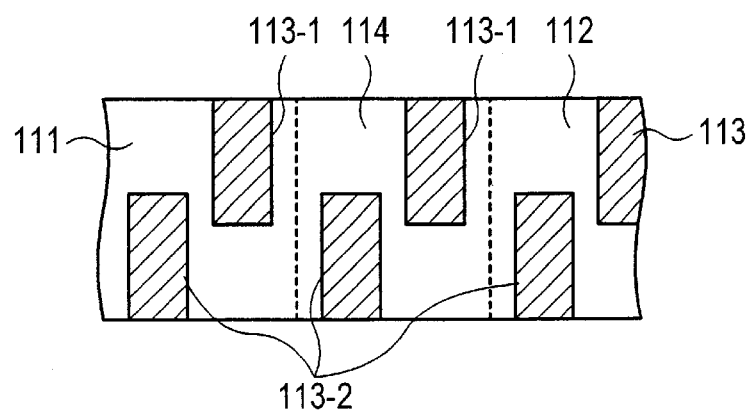
FIG. 20 is a plan view of the gate electrode metal film of the dual gate in the semiconductor device according to a ninth embodiment of the present invention.
Figure 21:
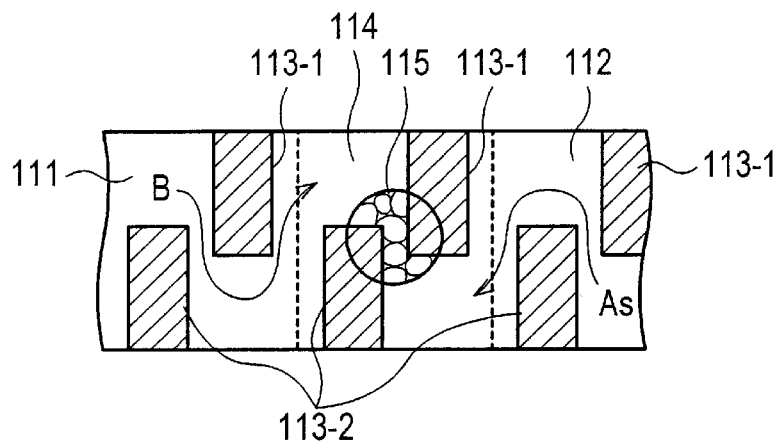
FIG. 21 is a plan view showing passage of impurity implanted in each gate in the gate electrode metal film in the semiconductor device according to the ninth embodiment of the present invention.

FIG. 20 is a plan view of the gate electrode metal film of dual gate possessed by the semiconductor device according to the ninth embodiment of the present invention. FIG. 21 indicates passage of the impurity implanted into each gate region in the gate electrode metal film.

The dual gate in the semiconductor device of this embodiment is formed as follows.

First, the impurity is implanted into the polysilicone film formed on the semiconductor substrate so as to form a p$^+$ gate 111 and a n$^+$ gate 112. A gate separating region 114 is secured between the p$^+$ gate 111 and n$^+$ gate 112. This gate separating region 114 is a non-doped polysilicone region in which no impurity is implanted.

A gate electrode metal film is formed of the WSi$_2$ over the p$^+$ gate 111, n$^+$ gate 112 and the gate separating region 114.

Next, the gate electrode metal film is patterned by photo etching. As shown in FIG. 20, a plurality of cutout portions 113-1, 113-2 are formed in the gate electrode metal film by this patterning. The respective cutout portions 113-1, 113-2 are located over the p$^+$ gate 111, n$^+$ gate 112 and the gate separating region 114. The plural cutout portions 113-1 are formed so as to be extended inward from one outer edge of the gate electrode metal film, while the plural cutout portions 113-2 are formed so as to be extended inward from the other outer edge opposing the one outer edge.

By provision of these cutout portions 113-1, 113-2, the gate electrode metal film, the gate electrode metal film has labyrinth structure if viewed as a path for the impurity to move.

A gap between the cutout portion 113-1 located above the gate electrode metal film 114 and the cutout portion 113-2 is preferred to be adjusted to less than 0.05μm. As shown in FIG. 21, in a region 115 between the cutout portion 113-1 located above the gate separating region 114 and the cutout portion 113-2, the WSi$_2$ composing the gate electrode metal film has the bamboo structure.

Thus, according to the semiconductor device of this embodiment, as same as the semiconductor device according to the fifth and sixth embodiments, the impurity invading into the gate electrode metal film from the p$^+$ gate 111 cannot pass a region 115 of the gate electrode metal film having the bamboo structure, so that it does not reach the n$^+$ gate 112. The impurity invading into the gate electrode metal film from the n$^+$ gate 112 cannot pass the region 115 of the gate electrode metal film having the bamboo structure either, so that it does not reach the p⁺ gate 111.

Further, according to the semiconductor device of this embodiment, as shown in FIG. 21, the gate electrode metal film has the labyrinth structure, thereby preventing a linear motion of the impurity in the gate electrode metal film. Thus, if the impurity tries to move from one gate to the other gate, the moving distance is prolonged, so that the probability that the impurity may reach the other gate further decreases.

Tenth Embodiment

The tenth embodiment of the present invention will be described below.

Meanwhile, a description of substantially the same structure and manufacturing method as the semiconductor device according to the first to ninth embodiments is omitted.

Figure 22:
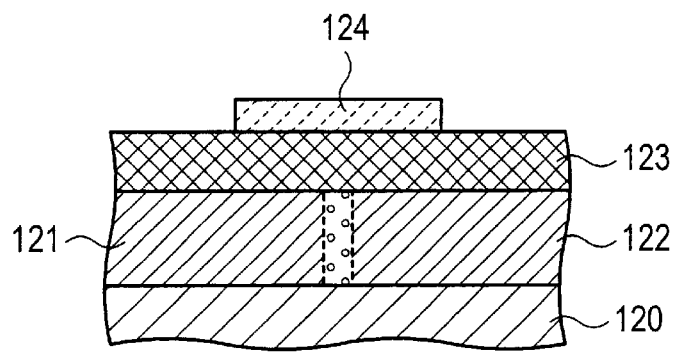
FIG. 22 is a sectional view of the dual gate portion in the semiconductor device according to a tenth embodiment of the present invention.
Figure 23:
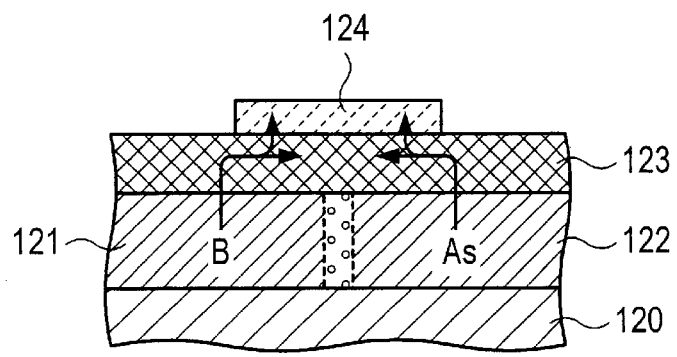
FIG. 23 is a sectional view showing passage of impurity implanted in each gate in the gate electrode metal film in the semiconductor device according to the tenth embodiment of the present invention.

FIG. 22 shows a section of dual gate portion possessed by the semiconductor device according to the tenth embodiment of the present invention. FIG. 23 indicates passage of the impurity implanted into each gate in the gate electrode metal film of the semiconductor device of the tenth embodiment.

The dual gate in the semiconductor device of this embodiment is formed as follows.

First, the impurity is implanted into the polysilicone film formed on the semiconductor substrate 120 so as to form a p⁺ gate 121 and a n⁺ gate 122. A gate separating region is secured between the p⁺ gate 121 and n⁺ gate 122. This gate separating region is a non-doped polysilicone region in which no impurity is implanted.

A gate electrode metal film 123 is formed over the p⁺ gate 121, n⁺ gate 122 and the gate separating region.

Next, non-doped silicone film is formed on the gate electrode metal film 123 by CVD method. The thickness of this silicone film is 0.02 to 0.1 $\mu$m.

Then, the silicone film is patterned by photo etching. As shown in FIG. 22, the silicone film 124 formed by this patterning covers a region up to about 50 $\mu$m inward of the p⁺ gate 121 from a boundary area between the p⁺ gate 121 and the gate separating region and a region up to about 50 $\mu$m inward of the n⁺ gate 122 from a boundary area between the n⁺ gate 122 and the gate separating region as well as the gate separating region.

When the impurity contained in the p⁺ gate 121 and n⁺ gate 122 tries to move to the other gate region through the gate electrode metal film, most of the moving impurity is absorbed in the silicone film 124 as shown in FIG. 23. Therefore, the probability that the impurity contained in one gate region may reach the other gate region located at an opposite position is extremely low.

As described above, because according to the semiconductor device of this embodiment, the silicone film 124 is formed over the gate electrode metal film 123 as a region for absorbing the impurity, the impurity implanted into one gate is prevented from reaching the other gate and diffusing there. Consequently, the characteristic of the semiconductor device is maintained in an excellent condition.

Eleventh Embodiment

The eleventh embodiment of the present invention will be described below.

Meanwhile, a description of substantially the same structure and manufacturing method as the semiconductor device according to the first to tenth embodiments is omitted.

Figure 24:
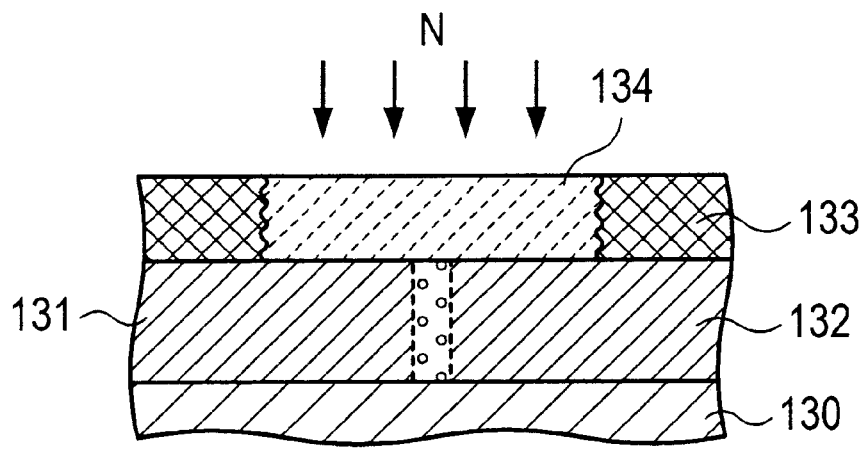
FIG. 24 is a sectional view of the dual gate portion in the semiconductor device according to an eleventh embodiment of the present invention.
Figure 25:
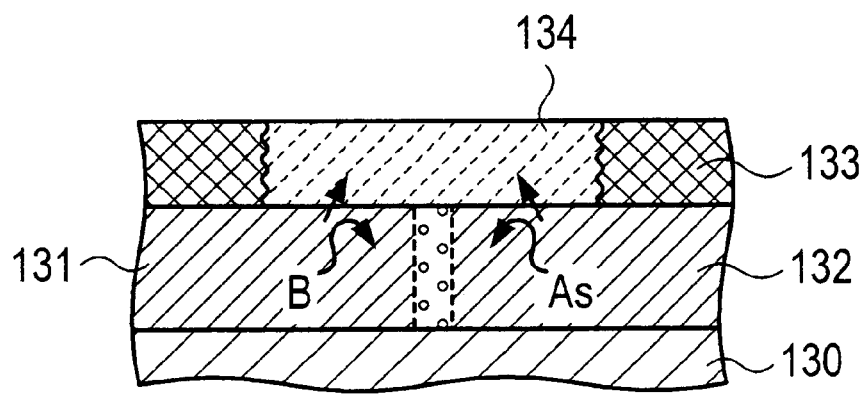
FIG. 25 is a sectional view showing passage of impurity implanted in each gate in the gate electrode metal film in the semiconductor device according to the eleventh embodiment of the present invention.

FIG. 24 shows a section of dual gate portion possessed by the semiconductor device according to the eleventh embodiment of the present invention. FIG. 25 indicates passage of the impurity implanted into each gate in the gate electrode metal film of the semiconductor device of the eleventh embodiment.

The dual gate in the semiconductor device of this embodiment is formed as follows.

First, the impurity is implanted into the polysilicone film formed on the semiconductor substrate 130 so as to form a p⁺ gate 131 and a n⁺ gate 132. A gate separating region is secured between the p⁺ gate 131 and n⁺ gate 132. This gate separating region is a non-doped polysilicone region in which no impurity is implanted.

A gate electrode metal film 133 is formed over the p⁺ gate 131, n⁺ gate 132 and the gate separating region.

Next, as shown in FIG. 24, N ion is implanted into the gate electrode metal film 133 so as to form a N doping region 134. This N doping region 134 covers a region up to about 50 $\mu$m inward of the p⁺ gate 131 from a boundary area between the p⁺ gate 131 and the gate separating region and a region up to about 50 $\mu$m inward of the p⁺ gate 132 from a boundary area between the n⁺ gate 132 and the gate separating region as well as the gate separating region.

When the impurity contained in the p⁺ gate 131 and n⁺ gate 132 moves to the other gate region through the gate electrode metal film 133, a diffuison of the impurity is prevented by the N doping region 134 as shown in FIG. 25. Therefore, the probability that the impurity contained in one gate region may reach the other gate region located at an opposite position is extremely low.

As described above, because according to the semiconductor device of this embodiment, the N doping region 134 is formed in the gate electrode metal film 133, the impurity implanted into one gate is prevented from reaching the other gate and diffusing there. Consequently, the characteristic of the semiconductor device is maintained in an excellent condition.

The preferred embodiments of the present invention have been described with reference to the accompanying drawings. However, the present invention is not restricted to these embodiments. It is apparent to those skilled in the art that the present invention may be modified or corrected in various ways within a scope of technical philosophy described in the claims of the present invention and needless to say, they also belong to the technical field of the present invention.

As described above, because according to the semiconductor device of this embodiment, the N doping region 134 is formed in the gate electrode metal film 133, the impurity implanted into one gate is prevented from reaching the other gate and diffusing there. Consequently, the characteristic of the semiconductor device is maintained in an excellent condition.

What is claimed is:

1. A semiconductor device comprising:
    a first gate region composed of a semiconductor containing a first impurity;
    a second gate region composed of a semiconductor containing a second impurity;
    a gate separating region between the first and second gate regions; and
    a gate electrode film adjoining the first gate region and the second gate region,
    the gate electrode film having a sectional area over the gate separating region that is smaller than a diameter of crystal grains of material of the gate electrode film.

2. A semiconductor device comprising:
    a first gate region composed of a semiconductor containing a first impurity;
    a second gate region composed of semiconductor containing a second impurity;
    a gate separating region between the first and second gate regions; and a gate electrode film adjoining the first gate region and the second gate region, the gate electrode film having plural pits in a region thereof over the gate separating region, gaps between the pits being smaller than a diameter of crystal grains of material of the gate electrode film.

3. A semiconductor device comprising:

a first gate region composed of a semiconductor containing a first impurity;

a second gate region composed of semiconductor containing a second impurity; and a gate electrode film adjoining the first gate region and the second gate region, the gate electrode film having cutout areas so as to have a labyrinth configuration connecting the first gate region to the second gate region.

4. A semiconductor device comprising:

a first gate region composed of a semiconductor containing a first impurity;

a second gate region composed of a semiconductor containing a second impurity;

a gate electrode film adjoining the first gate region and the second gate region; and an impurity trap region that absorbs the first impurity that moves into the gate electrode film from the first gate region and the second impurity that moves into the gate electrode film from the second gate region.

5. A semiconductor device according to claim 4, wherein the impurity trap region adjoins a bottom face of the gate electrode film.

6. A semiconductor device according to claim 4, wherein the impurity trap region adjoins a top face of the gate electrode film.

7. A semiconductor device according to claim 4, wherein the impurity trap region is formed from a part of the semiconductor of the first gate region that is without doped impurities and from a part of the second gate region that is without doped impurities.

8. A semiconductor device comprising:

a first gate region composed of a semiconductor containing a first impurity;

a second gate region composed of a semiconductor containing a second impurity; and a gate electrode film adjoining the first gate region and the second gate region, the gate electrode film having an impurity diffusion preventing region that prevents diffusion of the first impurity and the second impurity, the impurity diffusion preventing region being a region implanted with nitrogen ions.

9. A semiconductor device according to claim 1, wherein the sectional area is only over the gate separating region.

10. A semiconductor device according to claim 1, wherein the gate separating region is non-doped polysilicon.

11. A semiconductor device according to claim 2, wherein the region of the plural pits is only over the gate separating region.

12. A semiconductor device according to claim 2, wherein the gate separating region is non-doped polysilicon.

13. A semiconductor device according to claim 3, further comprising a gate separating region between the first and second gate regions.

14. A semiconductor device according to claim 13 wherein the gate electrode film having cutout areas is formed over the first and second gate regions and the gate separating region.

15. A semiconductor device according to claim 3, wherein the gate separating region is non-doped polysilicon.

* * * * *